United States Patent
Spits et al.

(10) Patent No.: US 9,039,832 B2
(45) Date of Patent: *May 26, 2015

(54) HIGH PRESSURE HIGH TEMPERATURE (HPHT) METHOD FOR THE PRODUCTION OF SINGLE CRYSTAL DIAMONDS

(75) Inventors: Raymond Anthony Spits, Freeport Ballasalla (GB); Carlton Nigel Dodge, Freeport Ballasalla (GB)

(73) Assignee: Element Six Technologies Limited (GB)

( * ) Notice: Subject to any disclaimer, the term of this patent is extended or adjusted under 35 U.S.C. 154(b) by 948 days.

This patent is subject to a terminal disclaimer.

(21) Appl. No.: 13/144,512

(22) PCT Filed: Jan. 15, 2010

(86) PCT No.: PCT/GB2010/000059
§ 371 (c)(1),
(2), (4) Date: Jul. 14, 2011

(87) PCT Pub. No.: WO2010/082029
PCT Pub. Date: Jul. 22, 2010

(65) Prior Publication Data
US 2011/0271900 A1    Nov. 10, 2011

(30) Foreign Application Priority Data

Jan. 16, 2009  (GB) ................... 0900771.7

(51) Int. Cl.
| C30B 29/04 | (2006.01) |
| B01J 3/06 | (2006.01) |
| B01J 23/745 | (2006.01) |
| B01J 23/75 | (2006.01) |
| B01J 23/755 | (2006.01) |

(52) U.S. Cl.
CPC .............. *C30B 29/04* (2013.01); *B01J 3/062* (2013.01); *B01J 23/745* (2013.01); *B01J 23/75* (2013.01); *B01J 23/755* (2013.01); *B01J 2203/061* (2013.01); *B01J 2203/062* (2013.01); *B01J 2203/0655* (2013.01); *B01J 2203/068* (2013.01)

(58) Field of Classification Search
USPC ............................ 117/4, 5, 68, 929; 423/446
See application file for complete search history.

(56) References Cited

U.S. PATENT DOCUMENTS

| 4,034,066 A | 7/1977 | Strong et al. |
| 4,836,881 A | 6/1989 | Satoh et al. |

(Continued)

FOREIGN PATENT DOCUMENTS

| EP | 0136408 | 4/1985 |
| EP | 0290044 | 9/1988 |

(Continued)

OTHER PUBLICATIONS

International Search Report for PCT/GB2010/000059, dated Mar. 25, 2010.

(Continued)

*Primary Examiner* — Robert M Kunemund
(74) *Attorney, Agent, or Firm* — Bryan Cave LLP

(57) ABSTRACT

A high pressure high temperature (HPHT) method for synthesizing single crystal diamond, wherein a single crystal diamond seed having an aspect ratio of at least (1) and a growth surface substantially parallel to a {110} crystallographic plane is utilized is described. The growth is effected at a temperature in the range from 1280° C. to 1390° C.

12 Claims, 4 Drawing Sheets

(56) References Cited

U.S. PATENT DOCUMENTS

| | | | | |
|---|---|---|---|---|
| 5,772,756 A | * | 6/1998 | Davies et al. | 117/79 |
| 6,096,129 A | | 8/2000 | Saito et al. | |
| 2006/0231015 A1 | | 10/2006 | Meguro et al. | |
| 2006/0266279 A1 | | 11/2006 | Mokuno et al. | |

FOREIGN PATENT DOCUMENTS

| | | |
|---|---|---|
| EP | 0589464 | 3/1994 |
| EP | 1671726 | 6/2006 |
| JP | 03 217226 | 9/1991 |
| WO | 9322482 | 11/1993 |
| WO | 2006061707 | 6/2006 |
| WO | 2007066215 | 6/2007 |
| WO | 2008107860 | 9/2008 |

OTHER PUBLICATIONS

Burns, R.C. et al, Growth of high purity large synthetic diamond crystals, Diamond and Related Materials, Nov. 30, 1988, 1433-1437, 8.

Hutchings, I.M., Tribology: Friction and wear of engineering materials, 1992, 8-9, Edward Arnold, London, England.

Glazer et al., "An automatic optical imaging system for birefringent media," Proc. R. Soc. Lond. A 452, 1996, 2751-65.

International Search Report for PCT/IB2008/050851, dated Aug. 13, 2008.

UK Search Report for GB 0704516.4 dated Jun. 4, 2007.

UK Search Report for GB 0704516.4 dated Aug. 22, 2007.

\* cited by examiner

HIGH PRESSURE HIGH TEMPERATURE (HPHT) METHOD FOR THE PRODUCTION OF SINGLE CRYSTAL DIAMONDS

The present invention relates to a method for producing diamond material. In particular, the present invention relates to HPHT methods for production of large single crystal diamond for use in cutting applications.

Synthesis of diamond by the temperature gradient HPHT method is well known in the art and was first described in U.S. Pat. No. 4,034,066.

Conventional methods of diamond synthesis can produce single crystal diamonds of up to a few carats (about 8 mm largest lateral dimension). Although some exceptionally large stones have been reported in R. C. Burns et al, Diamond and Related Materials, 8 (1999), 1433-1437, these are not routinely available due to the increased complexity in production.

Maximising the fraction of the total volume of each crystal that can be used in a finished product is an important challenge in diamond synthesis. For a range of products ranging from synthetic gem stones to substrates for homoepitaxial growth, there is a drive to produce diamond material wherein the final shape of the grown diamond is such that it can be processed with minimal effort to access preferred crystallographic planes for use in target applications. In addition, for many of these products there is a size requirement that makes it advantageous for such shapes to be achieved for crystals above particular size thresholds.

In addition, in some applications it is important for the diamond material in the finished product to have uniform optical properties. It is well known that the optical properties (for example optical absorption) of diamond may be strongly affected by its nitrogen content and that this is in turn sensitive to the growth sectors in the grown crystal. For instance the solubility of single substitutional nitrogen in the {111} growth sector can be more than a factor of a hundred greater than in the {110} growth sector. Hence for some applications, including some mechanical ones, improved performance is offered by material consisting of one or predominantly one growth sector.

The morphology of HPHT synthesised diamond crystals can be tuned to a certain extent by varying the growth temperature. There is, however, a limit to the extent to which extremely cubic or octahedral crystals can be produced using temperature alone to tune the morphology.

In the growth of large diamond crystals by the reconstitution or temperature gradient method it is important to maintain the position of the seed crystals at the lower end of the temperature gradient. For this reason, the seeds from which diamond crystals are grown are generally retained in a ceramic carrier. The presence of the carrier means that crystals can generally only grow into half of the full solid angle. After growth the seed crystal remains exposed on the seed face of the grown large crystal. In addition the growing crystals, whilst typically exhibiting a combination of {100}, {111} and {110} faces, can typically display different versions of a "cubic" shape: either half a cube, with the seed face parallel to one of the cube faces, or with the seed face following the diagonal plane across a cube face.

The industrial diamond market has had an ongoing requirement for synthetic diamond plates with an edge length of 1 mm and greater for a variety of applications including the machining of acrylics, telescope mirrors, resin moulds and more recently the machining of LCD panel display units. In addition, profile cutters are used for a variety of applications from cutting precious metals to optical products. The main issue in supplying the market is the availability constraint and the quality. Often a particular crystallographic orientation is desired (in the order they are presented, the {111}, {110} and {100} planes demonstrate decreasing abrasion resistance), and toolmakers may favour a product with a <110> edge over a <100> because it is more abrasive. In addition, tool pieces with one long edge length may be required and many of these products have a large aspect ratio and are inefficiently cut from near equiaxed plates.

There are several issues associated with producing high quality synthetic diamond having at least one long dimension, particularly for use in tool applications.

In order to produce suitably sized material, long synthesis cycle times are generally required with increased risk of hardware control failure and growth variation. In addition the number of seeds is greatly reduced in order to facilitate growth space. The combined effect of this is a relatively intensive use of industrial synthesis capacity and significantly reduced market availability.

A second issue associated with the growth of large diamonds is the control of crystal quality both in terms of shape, size variation and inclusion uptake: generally the larger the stone the higher the probability that one or more of these quality issues will occur.

A third issue is the amount of pre-preparation or material removal that needs to take place before the desired tool is produced. If an as-synthesized material can be provided that represents a near net shape for the desired tool pieces, processing costs will be reduced as more of the bulk of the synthesised diamond can be converted into a tool piece. This increases the utilisation of material, and allows for an increase in synthesis capacity, as material can be synthesised more efficiently to meet the near-net shape requirements, resulting in higher seeding densities, shortened cycle times and hence greater numbers of suitable diamonds per synthesis cycle.

U.S. Pat. No. 4,836,881 describes a method for synthesizing a large single crystal diamond which addresses two problems reported in the prior art, specifically maintaining a good quality while minimising excessive inclusion formation. This document describes synthesizing diamond from a large seed crystal having a diameter of greater than 3 mm.

The method of U.S. Pat. No. 4,836,881 teaches that, in order to produce single crystal diamond of good quality while avoiding excessive inclusion formation, it is necessary to provide a dissolution layer just above the seed which during the early stages of the process leads to the etching and subsequent removal of damage from the seed surface. The second stage is to control the flux of carbon to the surface via tailoring the geometry and dimensions of the solvent slug.

WO2008/107860 describes an HPHT method for producing single crystal diamond where the seed is selected so as to have a growth surface with an aspect ratio of at least 1.5. This is reported to produce synthetic single crystal diamond material having a reduced metallic inclusion content.

There is a need for a simple method by which it is possible to produce high quality single crystal diamond material which has a long edge length and which has crystallographic orientation properties tailored for the application in which it is to be used.

In this regard, the present invention provides a method for synthesizing single crystal diamond comprising:
  (a) selecting a single crystal diamond seed having a growth surface with two orthogonal dimensions a* and b*, where a* is the longest dimension of the growth surface substantially aligned along a <100> or <110> direction in the plane of the growth surface, and b* is the longest dimension of the growth surface in a direction orthogonal to a* lying in the plane of the growth surface, where the aspect ratio of the growth surface which is defined as a*/b* is at least 1 and the growth surface has a {110} crystallographic orientation;

(b) mounting the seed on or into a surface of a substrate such that the growth surface of the seed is exposed and the growth surface of the seed is substantially parallel to the surface of the substrate; and (c) effecting crystal growth in a high pressure high temperature environment at a temperature in the range from 1280° C. to 1390° C. under conditions such that a single crystal diamond is produced on at least the growth surface of the seed; wherein the synthesized single crystal diamond has a longest dimension $a^\#$ aligned along a <100> or <110> direction, which exceeds at least 2 mm.

The present inventors have surprisingly found that by selecting to use a seed which has a {110} growth surface in combination with effecting the crystal growth under HPHT conditions within a controlled temperature range, it is possible to produce high quality single crystal diamond which has an as-synthesized morphology having a large size in at least one dimension, and wherein only minimal, if any, processing is required in order to expose highly wear resistant {110} crystallographic planes. This means that the single crystal diamond produced by the methods of the present invention is particularly useful in tool applications where abrasion resistance is a requirement and long edges are desirable. In addition, as the single crystal diamond has a shape and dimensions which are suitable for a number of different applications, time consuming post-synthesis cutting steps, which can result in wasting significant amounts of diamond material, are reduced.

The present inventors have found that the morphology and hence the combination of cube or octahedral faces presented by synthetic single crystal diamond material can be influenced by the choice of seed crystallographic orientation. For example, diamonds grown from a cubic seed (i.e. from a seed with a {001} growth surface) in a growth environment conducive to sustaining cubic growth will produce a square-faced block as the final shape, whereas diamond grown from a {110} oriented plane can produce a final shape that is equivalent to half a {100}-faced cube sliced down a diagonal of one of its six faces.

Advantageously, by effecting the crystal growth at a temperature in the range from 1280° C. to 1320° C. in the present invention, the as-synthesized single crystal diamond material has a "cold" morphology. This means that the as-synthesized material has a "cubic" morphology. This is advantageous because a near half cube has a long <110> edge which lends itself to chisel dressing applications having a higher abrasion resistance than a <100> edged counterpart.

Alternatively, by controlling the temperature to be in the range from 1350° C. to 1390° C. during the crystal growth, the single crystal diamond material produced has a "hot" morphology. This means that the as-synthesized material has an "octahedral" morphology. This is advantageous because a near octahedron lends itself to single-point dressing applications. Such tools generally have a pyramidal tip, wherein a small flat surface is formed at the end of this pyramidal tip. The octahedral morphology of the as-synthesized material produced by the method of the present invention means that a {110} plane is formed at the end of the tip as opposed to the less abrasion resistant {100} surface usually seen in such applications.

A further advantage observed when using the method of the present invention is that for a given period of single crystal growth, a synthesized single crystal diamond with larger dimensions is obtained as compared to the products obtained by the methods disclosed in the prior art.

The morphology of an as-synthesised stone can be described by its "crystal morphology index" or "CMI". This is a scale which had been used for several years in the present field. In essence, the CMI is the fractional cut back at each cube corner seen in plan made by the matching {111} planes on a scale of 0 to 8. A perfect cube (comprising 6 {100} facets) has a CMI of 0 and a perfect octahedron (comprising eight {111} facets) has a CMI of 8. A perfect cubo-octahedron (comprising six {100} facets and eight {111} facets) has a CMI of 4. Crystals which are bounded by a mixture of {100} and {111} type faces have CMI values that are greater than 0 and less than 8.

As used herein, the term "cubic" describes a morphology that is equivalent to half a cube sliced down a diagonal of one of its six faces. Such a morphology is bounded by predominantly {100} facets (often referred to as "4-point planes" by those skilled in the art) with a {110} forming the base of the half cube. Other minor facets, such as {110}, {111}, {113}, {115} etc. may be present at the intersection of, the major facets.

As used herein, the term "octahedral" describes a single crystal diamond material grown from a seed with a growth surface having a {110} crystallographic orientation with <100> and <110> edges and which has the shape of a pyramid with a surface comprising a mixture of {100}, {110} and {111} faces. In particular, the base is parallel to a {110} plane, the pyramidal surfaces which intersect the base parallel to <100> directions are {100} planes, and the pyramidal surfaces which intersect the parallel to <110> directions are {111} planes. Often there is a small {110} facet parallel to the base at the apex of the pyramid. Other minor facets, such as {110}, {113}, {115} etc. may be present at the intersection of the major facets.

It should be noted that this morphology is not the same as a natural octahedral stone, which, in the ideal case, has an outer surface all eight surfaces of which are of the form {111}.

Those skilled in the art may refer to {110} planes as "2-point planes", <110> directions as "2-point directions", {111} planes as "3-point planes", <111> directions as "3-point directions", {100} planes as "4-point planes", and <100> directions as "4-point directions. Such usage is particularly prevalent in the diamond tool making and gem polishing industries.

As used herein, the term "longest dimension" refers to the maximum or largest dimension, fulfilling any additional conditions given such as crystallographic orientation.

The first step in the method of the present invention is the selection of a single crystal diamond seed having a growth surface having a {110} crystallographic orientation and having an aspect ratio of at least about 1.

The seed is a single crystal diamond, preferably a synthetic single crystal diamond. The synthetic single crystal diamond seed can be either a high pressure-high temperature (HPHT) diamond or a chemical vapour deposition (CVD) diamond, but is preferably a HPHT diamond. Where an HPHT diamond is used, it may be a type Ib or type IIa or type IIb synthetic diamond, but is preferably a type Ib synthetic diamond.

The single crystal diamond seed used in the method of the present invention may be produced by cutting a slice of diamond having surfaces close to a {110} plane from raw diamond material. The seed may then be cut from a {110} plane of diamond, for example by use of a mechanical blade or suitable laser into square or rectangular "blocks", with the surface which will ultimately form the growth surface being parallel to a {110} plane and being surrounded by opposing pairs of <110> and <100> edges. Alternatively, it is possible to use seeds bounded by different faces and edges. Alternatively, still seeds can be sourced from synthetic or natural diamond grit having regular crystal habit and oriented to facilitate growth on a {110} plane by positioning of this plane so it is exposed to the solute and parallel to the ceramic seed carrier surface.

The term "growth surface" is used throughout the specification to describe the surface of the seed upon which growth will be effected, and thus upon which new material will be grown, in the method of the present invention. Typically, the growth surface of the seed will be approximately parallel to a surface of the substrate onto which it is generally mounted and is the surface presented to the solvent catalyst and carbon growth species present in HPHT processes. Growth will occur away from the growth surface of the seed in all directions above the surface of the substrate, although the rate of growth in a particular direction will be dependent upon the growth sector of the growth and the growth conditions. Advantageously the growth surface will be a major face of the seed although this is not a requirement of the present invention.

The single crystal diamond seed selected has a growth surface close to a {110} face. This means that the single crystal diamond to be produced will have as-grown {100}, {111} and {110} faces. In this regard, preferably the single crystal diamond seed has a growth surface the normal of which is within approximately 20° of a <110> direction. More preferably, the single crystal diamond seed has a growth surface the normal of which is within approximately 15° of a <110> direction. More preferably the single crystal diamond seed has a growth surface the normal of which is within approximately 10° of a <110> direction. More preferably, the single crystal diamond seed has a growth surface the normal of which is within approximately 5° of a <110> direction. The single crystal diamond seed may have a growth surface the normal of which is within 0° of a <110> direction. The edges of the growth surface are within about 20°, preferably about 15°, preferably about 10°, preferably about 5° or even 0° of either <100> or <110> directions or a mixture of <100> and <110> directions. Preferably, two opposed edges of the seed are within about 20°, preferably about 15°, preferably about 10°, preferably about 5° or even 0° of a <100> direction and a further two opposed edges of the seed are within about 20°, preferably about 15°, preferably about 10°, preferably about 5° or even 0° of a <110> direction, such that the seed is approximately square or rectangular. The side facets of the single crystal diamond seed are within about 20°, preferably about 15°, preferably about 10°, preferably about 5° or even 0° of being perpendicular to the growth surface.

The seed is selected so as to have an aspect ratio of 1 or more. As used herein, the term "aspect ratio" refers to the ratio a*/b* of the longest or maximum length or dimension of the growth surface of the seed, a*, substantially aligned along a <100> or <110> direction, in the plane of the growth surface, to the orthogonal or perpendicular direction lying in the plane of the growth surface, b*. The term "substantially aligned" as used herein requires that the dimension is within approximately 20°, preferably within approximately 15°, preferably within approximately 10°, preferably within approximately 5° or even 0° of being parallel to the direction to which reference is made.

The growth surface of the single crystal diamond seed has an aspect ratio, a*/b*, of at least about 1, preferably at least about 1.5, preferably at least about 2.0, preferably at least about 2.5, preferably at least about 3, preferably at least about 4, preferably at least about 5, preferably at least about 10. The choice of the aspect ratio of the single crystal diamond seed will depend on the dimensional aspect ratio of the targeted single crystal diamond product.

In one embodiment, the growth surface of the single crystal diamond seed may have an aspect ratio, a*/b*, in the range from about 1 to less than about 1.5. In this regard, the single crystal diamond seed may have an aspect ratio, a*/b*, in the range from about 1 to about 1.4, in the range from about 1 to about 1.3, in the range from about 1 to about 1.2.

In some embodiments, the edge length of the growth surface of the seed may be maximised, and the surface area of the growth surface of the seed minimised, by choosing a seed with a high aspect ratio. The maximisation of the edge length provides the desirable object of a synthetic single crystal diamond suitable for use, for example, as a single point turning tool. The minimisation of the surface area substantially reduces, or even eliminates, the problems of multiple nucleation and inclusion of metallic solvent at the early stages of synthesis that are commonly encountered problems associated with the use of large substrates, as reported in the prior art. This is particularly the case where the growth surface of the single crystal diamond seed has a dimension b* which is particularly small.

Advantageously, the content of metallic inclusions has been found to be reduced where the growth surface of the single crystal diamond seed of the present invention has a dimension b* of less than about 2 mm, preferably less than about 1.5 mm, preferably less than about 1 mm, more preferably less than about 0.5 mm. Without wishing to be bound by any particular theory, it is believed that this is as a consequence of reducing the probability of multiple nucleation occurring.

If the aspect ratio of the seed is too large, non-hydrostatic stresses imposed on the seed, particularly during the ramp to synthesis temperature and pressure, can result in the seed either bending or cracking or both. This effect can partially be alleviated by increasing the depth of the seed (that is, the dimension of the seed in a direction perpendicular to the surface intended to be the growth surface during synthesis). Even so there is a practical upper limit to the aspect ratio of the growth surface. The aspect ratio of the growth surface is preferably less than about 30, preferably less than about 20.

The shape of the growth face of the seed is not limited. However, typically and preferably, the growth face of the seed is square or rectangular with edges substantially aligned along the <100> or <110>, in which case b* is the shortest dimension of the growth face of the seed. Seeds can be used with truncated corners, or other features which mean the seed growth face is not a perfect rectangle. Preferably there are no truncated corners. Further discussion shall focus on square and rectangular seeds for simplicity but this does not reduce the generality of the invention.

In a further aspect, the present invention relates to the use of a single crystal diamond seed crystal having a growth surface having a {110} crystallographic orientation and an aspect ratio of at least about 1.0 in a high pressure high temperature method for synthesizing diamond.

It is furthermore desirable that the growth surface of the single crystal diamond seed has a large longest dimension a*, where a* is the longest dimension of the growth surface substantially aligned along a <100> or <110> direction. Preferably, the growth surface of the single crystal diamond seed has a dimension a* of at least about 0.25 mm, preferably at least about 0.5 mm, preferably at least about 1 mm, preferably at least about 2 mm, preferably at least about 3 mm, preferably at least about 4 mm, preferably at least about 5 mm, preferably at least about 6 mm.

As defects tend to propagate from the seed through to the material grown on the seed, it is preferred that the seed selected contains a minimum number of defects. More specifically, it is preferred that, when viewed using an optical microscope at a total magnification of ×10, the surface which will be the growth surface of the seed has an average count of surface defects due to inclusions that is less than about 300 per mm$^2$, preferably less than about 100 per mm$^2$, preferably less than about 80 per mm$^2$, preferably less than about 60 per mm$^2$, preferably less than about 30 per mm$^2$, preferably less than about 10 per mm$^2$, preferably less than about 5 per mm$^2$, preferably less than about 2 per mm$^2$, preferably less than about 1 per mm$^2$, preferably zero per mm$^2$.

Advantageously, the single crystal diamond seed is selected is such that at least about 30%, more preferably at least about 50%, more preferably at least about 75%, more preferably at least about 80%, more preferably at least about 85%, more preferably at least about 90%, more preferably at least about 95% of the area of the surface of the seed that will become the growth surface when synthesis starts is a single growth sector. This is advantageous because it means that the single crystal diamond grown on the seed will contain fewer extended defects, since these typically propagate from regions of high strain in the seed and in particular from regions adjacent to growth sector boundaries in the seed.

Advantageously, the single crystal diamond seed selected has a low level of strain. This is advantageous because it reduces the probability of multiple nucleation occurring and thus reduces the content of metallic inclusions in the single crystal diamond material produced by growth on the seed. Strain in diamond is most easily evaluated using polarised light microscopy or similar techniques (for example, using an instrument such as "Metripol" (Oxford Cyrosystems, Oxford, UK) which enables the optical retardation of the crystal to be determined over large areas). Since a perfect strain-free diamond is cubic, it is black when viewed in transmission between a pair of crossed polars. The addition of a non-homogeneous strain results in the cubic symmetry of the crystal being lost and the sample becoming birefringent. The level of birefringence can be quantified. The level of birefringence recorded is also related to the number of metallic inclusions present in the material. The greater the content of metallic inclusions, the higher the birefringence recorded. Thus a low birefringence level is indicative of low inclusion content.

Preferably the seed has a birefringence over at least about 50% of the area of the growth surface of the seed, more preferably at least about 60% of the area of the growth surface of the seed, more preferably at least about 70% of the area of the growth surface of the seed, more preferably at least about 80% of the area of the growth surface of the seed, that is less than about 5×10$^{-3}$, more preferably less than about 1×10$^{-3}$, more preferably less than about 5×10$^{-4}$, more preferably less than about 1×10$^{-4}$, wherein the direction of view is normal to the growth surface of the seed.

The single crystal diamond seed which is selected in step (a) of the method of the present invention may be used in its as-grown state. Alternatively, the seed may be subjected to processing steps prior to its use in the method of the present invention. Where such steps are included, an improvement in the quality of the surface and edges of the seed may be obtained. For example, one or more steps may be included to reduce edge chipping.

Preferably the edges of the single crystal diamond seed which is selected in step (a) of the method has low edge chipping. More specifically, it is preferred that, when viewed using an optical microscope at a total magnification of ×10, the edges of the growth surface of the seed has an average count of visible edge chips or defects that is less than about 30 per mm, preferably less than about 10 per mm, preferably less than about 5 per mm, preferably less than about 3 per mm, preferably less than about 2 per mm, preferably less than about 1 per mm, preferably zero per mm.

If the seed is to be processed prior to its use in the method of the present invention, the processing steps may include one or more of the following: scaif polishing and other mechanical processing steps such as lapping, plasma processing, reactive ion etching, high pressure-high temperature annealing (at temperatures of up to 2500° C.), high temperature annealing under high vacuum conditions (that is at a pressure of less than about 10$^{-4}$ mbar), high temperature annealing under a protective, non-oxidising atmosphere (for example argon or 1% hydrogen-in-argon).

Preferably the growth surface of the single crystal diamond seed of the present invention has a surface roughness, $R_a$ of less than about 1000 nm, preferably less than about 500 nm, preferably less than about 100 nm, preferably less than about 80 nm, preferably less than about 60 nm, preferably less than about 50 nm, preferably less than about 30 nm, preferably less than about 20 nm, preferably less than about 10 nm. If necessary, such a surface roughness can be achieved by polishing the seed.

The term "surface roughness, $R_a$" (sometimes referred to as "centre line average" or "c.l.a.") refers to the arithmetic mean of the absolute deviation of surface profile from the mean line measured by stylus profilometer, measured over a length of 0.08 mm, measured according to British Standard BS 1134 Part 1 and Part 2. The mathematical description of $R_a$ (from "Tribology", I. M. Hutchings, Pub. Edward Arnold (London), 1992, pages 8-9) is:

$$R_a = \frac{1}{L}\int_0^L |y(x)| dx$$

After selecting the seed, the method of the present invention may include an additional step of cleaning the seed. A hot oxidising acid mixture such as, for example, a mixture of concentrated sulphuric acid and potassium nitrate at a temperature in excess of about 150° C. may be used in this step, where it is included.

The method of the present invention comprises a second step (b), after step (a) and before step (c), of mounting the seed on or into a surface of a substrate such that the growth surface of the seed is exposed and the growth surface of the seed is substantially parallel to the surface of the substrate. In the art, the substrate is sometimes referred to as a "seed pad".

In high pressure high temperature (HPHT) synthesis of single crystal diamond material, the substrate is generally a seed pad into which the seeds are pressed in a way such that the face which will form the growth surface of the seed lies roughly in the plane of the surface of the seed pad.

In this step, the substrate on to which the seed is mounted may be made from any material commonly used to produce substrates in the field of HPHT synthesis. For example, the substrate may be made from a ceramic material such as an aluminium silicate, aluminium oxides, zirconium oxide or magnesium oxide. Further suitable materials include salts, such as alkali metal halides (of which sodium chloride is an example).

In order to improve the efficiency of the method of the present invention, it may be preferable to mount more than one single crystal diamond seed on the substrate thus enabling the simultaneous growth of a number of single crystal diamonds.

Where more than one seed is mounted on the substrate, there are many ways in which the seeds can be oriented on the substrate. It is preferred that the seeds are arranged in a regular array as this is more reproducible. Examples of possible arrangements of seed are shown in FIGS. 1(a) to (f). The seeds can be arranged in linear rows, which may or may not be staggered relative to other rows, or radially or in an arrangement which is a combination of radial and linear rows. A preferred arrangement is to use an arrangement of staggered rows as illustrated in FIG. 1(b).

The spacing of the seeds is preferably such that the distance between two adjacent seeds in the same row is within about 25% of the spacing between adjacent rows of seeds. The absolute value of the spacing is determined by the size of the seeds and the desired final size of the stones. It will be appreciated that the stones after they have grown should not impinge upon one another. It is also important that the growing stones do not get too close as this can affect the carbon flux to the sides of the stones and result in the shape becoming irregular to an undesirable extent.

If the initial seeds have dimensions a*×b* and are separated from adjacent seeds by a distance d and the final stones are to have dimensions A×B (where the directions in which A and B are measured are the same direction as a* and b* respectively) and have to be separated by a distance at least equal to D to ensure good growth, then $$d \geq D-(A-a^*) \text{ and } d \geq D-(B-b^*)$$

Step (c) of the method of the present invention comprises effecting crystal growth in a high pressure high temperature (HPHT) environment under conditions such that a single crystal diamond is produced.

Generally in an HPHT process, the substrate onto which the seed is mounted is assembled into a synthesis capsule with a carbon source, preferably high purity graphite or diamond, and a solvent-catalyst metal alloy. Where diamond is used as the carbon source, it is generally finely crushed diamond. The use of diamond as the carbon source is associated with several advantages. First, where graphite is used as a carbon source, there is a significant change in volume during the HPHT process. In contrast, this is avoided by the use of diamond as the carbon source where there is no net change in volume during the HPHT process. Second, the impurities of the synthesized single crystal diamond material are reduced where diamond is used as the carbon source.

Those skilled in the art will be aware that the exact arrangement of the seed pad, carbon source and solvent catalyst will be specific to the particular high pressure-high temperature apparatus that is being used.

The solvent-catalyst may be any known in the art, but preferably comprises manganese, cobalt, iron and nickel. Alloys predominantly comprising two or more of cobalt, nickel and iron may also be used. More preferably, the solvent-catalyst is an alloy comprising iron and nickel. More preferably, the solvent catalyst is an alloy comprising nickel, iron and cobalt. More preferably, the solvent catalyst is an alloy consisting of nickel, iron and cobalt. Preferably the solvent-catalyst components are prepared, purified and pre-alloyed by methods known to those skilled in the art so as to ensure growth of diamond crystals of adequate clarity, particularly in the sense of elimination of metal inclusions.

The HPHT process of step (c) is carried out under conditions such that a single crystal diamond is produced which preferably has a face in a plane substantially parallel to the growth surface of the seed crystal with a longest dimension of at least about 2 mm. The HPHT method may either be temperature driven or by means of reconstitution (also known in the art as the "reconstitution method").

Alternatively, the HPHT process may be pressure driven such as the phase-balance or graphite conversion processes with which the person skilled in the art will be familiar.

The HPHT process of step (c) of the present invention is carried out at a temperature in the range from 1280° C. to 1390° C.

In one embodiment of the present invention, the HPHT process is performed at a temperature in the range from 1280° C. to 1320° C., alternatively 1290° C. to 1310° C. This produces single crystal diamond material which has an as-synthesized "cold" morphology. Such material is particularly suitable for chisel dressing applications where a high abrasion resistance is required.

In an alternative embodiment, the HPHT process is performed at a temperature in the range from 1350° C. to 1390° C., alternatively 1360° C. to 1380° C. This produces single crystal diamond material which has an as-synthesized "hot" morphology. Such material is particularly suitable for single point dressing applications where a tip having a high abrasion resistance is desired.

Advantageously, the HPHT process is carried out at pressures of from about 5 GPa to about 6 GPa, with appropriate systems for the stabilisation of pressure and temperature during the process. The time of growth may extend from a few tens of hours to a few hundreds of hours depending upon the size of crystal desired, but is typically in the range about 50 to about 200 hours.

It will be appreciated by those skilled in the art that, within the criteria specified above, the exact operating conditions are dependent upon the type of diamond to be synthesised. For example, whilst the above conditions are suitable for the synthesis of type Ib diamond, the process windows for the synthesis of type IIa and IIb diamonds are likely to different, both in terms of the location of the window and the size of the window.

After completion of crystal growth in step (c) of the method of the present invention, the synthesized single crystal diamond can generally be simply broken off the substrate. Alternatively, the method of the present invention may optionally include, after step (c) an optional step of separating the single crystal diamond from the substrate.

The method of the present invention may also include an optional step, after step (c) of removing residual solvent-catalyst. This may be effected by, for example, dissolution in hot aqua regia or by any other technique known in the art.

The method of the present invention allows for the production of synthetic single crystal diamond material having an as-synthesized aspect ratio, $A^\#/B^\#$ of at least about 1, wherein the longest dimension the single crystal diamond material is at least about 2 mm.

Preferably the as-synthesised single crystal diamond material has a major face substantially parallel to the growth surface of the seed which has a longest dimension substantially aligned along a <100> or <110> direction in the plane of the major face, which exceeds at least about 2 mm.

Thus, the present invention provides synthetic single crystal diamond material having major faces and an as-synthesized aspect ratio, $A\#/B\#$, of at least about 1, wherein the longest dimension of an edge of a major face is at least about 2 mm.

As a consequence of the synthesis by an HPHT method, the single crystal diamond material of the present invention typically comprises at least about 5 ppm of nitrogen measured either by Fourier transform infrared spectroscopy (FTIR spectroscopy) or by secondary ion mass spectroscopy (SIMS). This means that it will have a yellow colour.

Synthetic diamond produced by HPHT methods has unique features that can be identified by photoluminescence (PL) spectroscopy. These are related to the incorporation of individual metal atoms from the solvent catalyst metal into the lattice of the diamond. Such unique features are observed in the material of the present invention.

For example it is reported in the literature that under 325 nm excitation, PL features thought to be associated with Co are observed at 523.8, 544.5, 561.7, 580.7 nm. With excitation at 632.8 nm, further peaks at 657.7, 669.2, 720.8, 722.8, 793.2, 807.6, 863.9, 868.8, 882.6, 884.7, 887.4 and 992.3 nm are also thought to be associated with Co.

Excitation at 632.8 nm of diamond synthesised using a nickel-containing solvent catalyst show nickel-related features at 657.7, 722.8, 793.2, 807.6, 868.8, 882.6 and 884.7 nm. Further nickel-related features are observed under 532 nm excitation at 728, 707, 751 nm. There is a feature believed to be due to $Ni^+$ in an interstitial site at 881 nm. The FTIR spectra of HPHT synthetic diamonds can have absorption features at 1332 $cm^{-1}$ due to $N^+$ (ionised single substitutional nitrogen); this is believed to be formed by charge-transfer between Ni and N yielding $N^+$ and $Ni^-$. As there is a correlation between the two, the absorption coefficient at 1332 $cm^{-1}$ can be used to determine the concentration of $Ni^-$. In some prior art it has been reported that the local Ni concentration is greater than 100 ppm in certain stones.

Advantageously, the single crystal diamond material of the present invention has an external morphology that is predominantly cubic, that is to say that at least about 35%, preferably at least about 45%, preferably at least about 50%, of the surface area of the as-grown stone comprises {100}-type planes. The remainder of the surface comprises a mixture of {110}-, {111}-, {113}- and {115}-type planes. It is preferred that of the area that is not {100}-type planes, the proportion that is not {110} is less than about 20%, preferably less than about 15%, preferably less than about 10% of the surface area.

Alternatively, the single crystal diamond material of the present invention has an external morphology that is predominantly octahedral, that is to say that at least about 10%, preferably at least about 15%, preferably at least about 20%, of the surface area of the as-grown stone comprises {111}-type planes. Preferably about 15%, preferably at least about 20%, preferably at least about 25%, of the surface area of the as-grown stone comprises {100}-type planes. The remainder of the surface comprises a mixture of {110}-, {113}- and {115}-type planes. It is preferred that of the area that is not {100}- or {111}-type planes, the proportion that is not {110} is less than about 20%, preferably less than about 15%, preferably less than about 10% of the surface area.

By producing single crystal diamond which has an external morphology which is predominantly cubic or predominantly octahedral, the number of steps required to process the diamond material into a form in which it can be used in the application of interest are minimised.

The single crystal diamond material of the present invention has an as-synthesized aspect ratio of about 10 or less, alternatively about 5 or less, alternatively about 4 or less, alternatively about 3 or less, alternatively about 2.5 or less, alternatively about 2 or less, alternatively about 1.5, alternatively about 1.2 or less. The term "as-synthesized aspect ratio" is used to refer to the aspect ratio, $A^\#/B^\#$, wherein $A^\#$ and $B^\#$ define a notional surface $S^\#$ in the single crystal diamond material substantially parallel to the {110}plane which is substantially parallel to the seed face of the as-synthesized single crystal diamond material and $A^\#$ is the longest dimension of the as-synthesized single crystal diamond material within the surface $S^\#$ substantially aligned along a <100> or <110> direction, and $B^\#$ is the longest dimension of the as-synthesized single crystal diamond material orthogonal to $A^\#$ within the surface $S^\#$, substantially aligned along a <100> or <110> direction The notional surface $S^\#$ may be a real external surface or a conceptual internal surface.

In one embodiment, the as-synthesized aspect ratio $A^\#/B^\#$ is in the range from about 1 to less than about 1.5. In this regard, the single crystal diamond material of the present invention may have an aspect ratio, $A^\#/B^\#$, in the range from about 1 to about 1.4, in the range from about 1 to about 1.3, in the range from about 1 to about 1.2.

The term "substantially parallel" as used herein requires that the direction or plane is within approximately 20°, preferably within approximately 15°, preferably within approximately 10°, preferably within approximately 5° or even 0° of being parallel to the direction or plane to which reference is made.

The term "substantially perpendicular" as used herein requires that the direction or plane is within approximately 20°, preferably within approximately 15°, preferably within approximately 10°, preferably within approximately 5° or even 0° of being perpendicular to the direction or plane to which reference is made.

The terminology "as-synthesized" requires that the single crystal diamond material has this aspect ratio as-grown and no further processing steps are required in order to obtain the recited aspect ratio.

The as-synthesised single crystal diamond material has a longest dimension $a^\#$ substantially aligned along a <100> or <110> direction and substantially parallel to the surface $S^\#$, that is at least about 2 mm, preferably at least about 3 mm, preferably about at least 4 mm, preferably at least about 5 mm, preferably at least about 6 mm, preferably at least about 7 mm, preferably at least about 8 mm, preferably at least about 10 mm, preferably at least about 12 mm. Preferably this longest dimension lies on the notional surface $S^\#$, such that $A^\#$ is $a^\#$ and $B^\#$ is the longest dimension of the diamond material orthogonal to $a^\#$. Preferably this longest dimension lies parallel to a major face, and more preferably lies in a major face. The term "major face" as used herein refers to the face of the material having the largest surface area. The major face(s) of the material will generally be in a plane which includes the longest dimension and is substantially parallel to the growth surface of the seed on which the diamond has been synthesized.

In one embodiment, the as-synthesised single crystal diamond material has a longest dimension $a^\#$ substantially aligned along a <100> or <110> direction and substantially parallel to the surface $S^\#$, that is less than about 8 mm, alternatively less than about 7 mm, alternatively less than about 6 mm, alternatively less than about 5 mm.

Single crystal diamonds which have such dimensions are particularly desirable for cutting applications.

The as-synthesized single crystal diamond material which may be produced by the method of the present invention is further characterised by comprising one or two dominant growth sectors. Advantageously, where the longest dimension of the as-synthesised single crystal diamond material lies on the notional surface $S^\#$, the surface $S^\#$ touches an as-synthesized external surface of the single crystal diamond material, which is substantially parallel to the seed face, at least one point.

The proportion of the preferred growth sectors can be determined by, for example, using an ultraviolet luminescence microscope such as a DiamondView™ instrument obtained from Diamond Trading Company, Maidenhead, UK. Different growth sectors incorporate nitrogen-related defects at different rates when exposed to essentially the same growth environment and consequently the intensity of luminescence due to nitrogen-related defects differs between growth sectors. Therefore the different growth sectors can be identified in the luminescence image. The proportions of the dominant growth sectors are determined from the luminescence image obtained by viewing approximately (that is, within about 20°) along the normal to the growth surface and comparing the area of the growth sector in the image with the total area of the stone in the image.

The as synthesised single crystal diamond of the present invention comprises at least about 50%, preferably at least about 60%, preferably at least about 70%, preferably at least about 80%, preferably at least about 85%, preferably at least about 90%, preferably at least about 95%, preferably at least about 98%, of either {100} and/or {111} growth sectors by volume.

Product prepared from the as synthesised single crystal diamond of the present invention preferably comprises at least about 60%, preferably at least about 70%, preferably at least about 80%, preferably at least about 85%, preferably at least about 90%, preferably at least about 95%, preferably at least about 98%, of either {100} and/or {111} growth sectors by volume.

As described above, an advantage of the synthetic single crystal diamond material produced by the methods of the present invention is that it has an as-synthesized size and shape which means that it is suitable for direct use in a number of applications without requiring further processing. It is particularly suitable in tool applications where a long, abrasion resistant edge is required.

Alternatively, if necessary for the application for which it is intended to be used, the single crystal diamond material of the present invention may be cut or sawn into plates. Where the diamond is to be cut, methods known in the art may be used. For example, by use of a conventional diamond sawyers' blade (a phosphor-bronze disc impregnated with fine diamond particles) and/or by means of a laser sawing system typically employing a Nd:YAG laser operating at a wavelength of 1.06 μm. Typically an as-grown stone will be sawn to remove the seed face (that is sawn parallel and close to the growth surface of the seed).

Thus, in a further aspect, synthesized single crystal diamond product cut from synthetic single crystal diamond material as defined herein is provided.

The synthetic single crystal diamond material of the present invention is particularly suitable for use in machining applications where a single long cutting edge is required to achieve the necessary workpiece surface finish, such as machining liquid crystal display screens, machining precious metal components (jewellery, "objets d'art", etc.), optical components such as minors and beam splitters.

The synthetic single crystal diamond material of the present invention is also particularly useful in single point dressing and chisel dressing applications.

In this regard, in a further aspect a cutting tool comprising synthetic single crystal diamond material as defined herein is provided.

The synthetic single crystal diamond material of the present invention may also advantageously be used as a substrate for the synthesis of homoepitaxial diamond by chemical vapour deposition processes.

The present invention is hereinafter described by reference to the following figures and examples which are in no way intended to limit the scope of protection claimed.

FIGS. 1(a) to (f) illustrate different arrangements of seeds mounted onto a substrate;

FIGS. 2(a) and (b) are schematic representations of octahedral and cubic single crystal diamond material produced by the methods of the present invention;

FIG. 2(c) is a schematic representation of a polished plate made by the process of the present invention;

FIGS. 3(a) and (b) are photoluminescence images, obtained using a DiamondView™ instrument, of the reference face and seed face of single crystal diamond material produced by the methods of the present invention;

FIGS. 4(a) and (b) side and plan view images respectively of cubic single crystal diamond material produced by the method of the present invention; and As described above, FIGS. 1(a) to (f) illustrate different arrangements of seeds (2) on a substrate (3). In all of these examples, the substrate (the "seed pad") is approximately cylindrical with the seeds arranged on one of the two planar surfaces. In these examples, the seeds are tessellated (with appropriate spaces between seeds and rows of seeds) to cover essentially the entire surface of the substrate. In FIG. 1(a) the seeds are arranged in rows wherein the seeds in a given row are aligned with seeds in adjacent rows.

In FIG. 1(b), the seeds are arranged in rows wherein the seeds in a row are offset in position with respect to the seeds in adjacent rows.

In FIG. 1(c), the seeds are arranged so as to extend out radially from a central point on the substrate.

In FIG. 1(d), the seeds are arranged on the substrate (3) in four separate blocks (4). In a block, the seeds are arranged in rows (6) wherein the seeds in a given row within a block are aligned with the seeds in adjacent rows in the block. All of the seeds in a given block are positioned at 90° to the seeds in an adjacent block.

In FIG. 1(e), the seeds (2) are arranged in rows on the substrate (3). Each row of seeds is adjacent to two other rows of seeds. The arrangement is such that the seeds in any given row (8) are aligned with the seeds in one adjacent row (12) and arranged offset in relation to the seeds in the other row (10).

In FIG. 1(f), the seeds (2) are arranged circumferentially around the circular substrate (3).

In FIG. 2(a), the morphology of a hot (predominantly octahedral) single crystal diamond material grown according to a method of the present invention is shown. The single crystal diamond has {110}, {100} and {111} faces (14, 16 and 18, respectively).

Figure 1A:
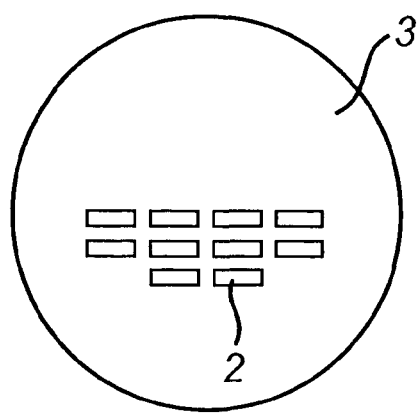
Figure 1B:
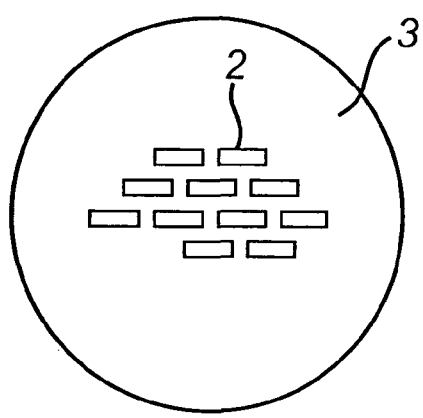
Figure 1C:
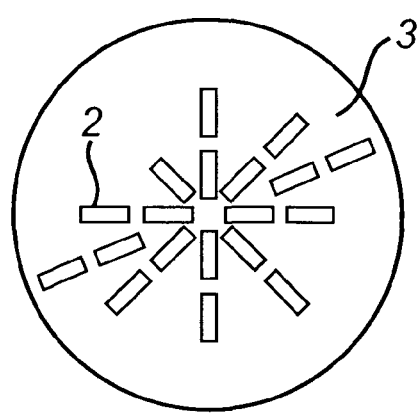
Figure 1D:
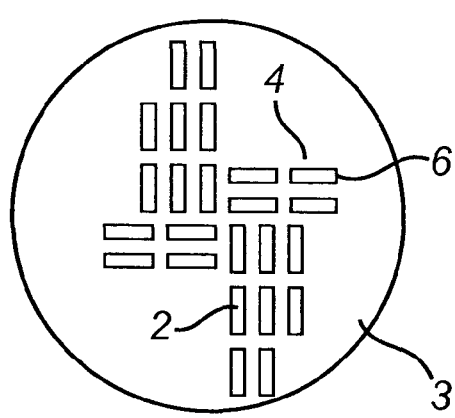
Figure 1E:
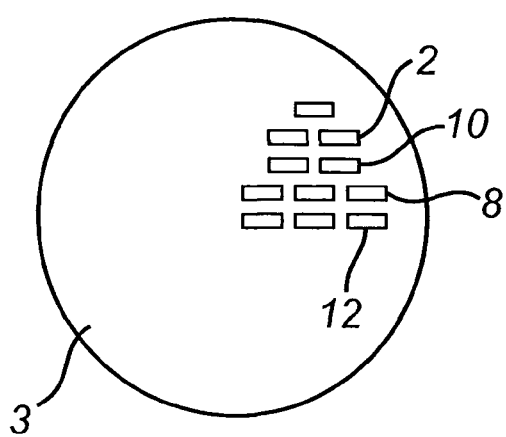
Figure 1F:
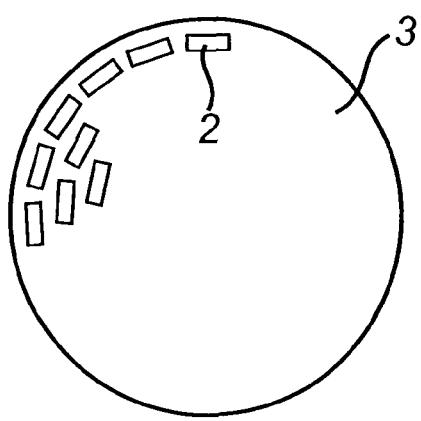
Figure 2A:
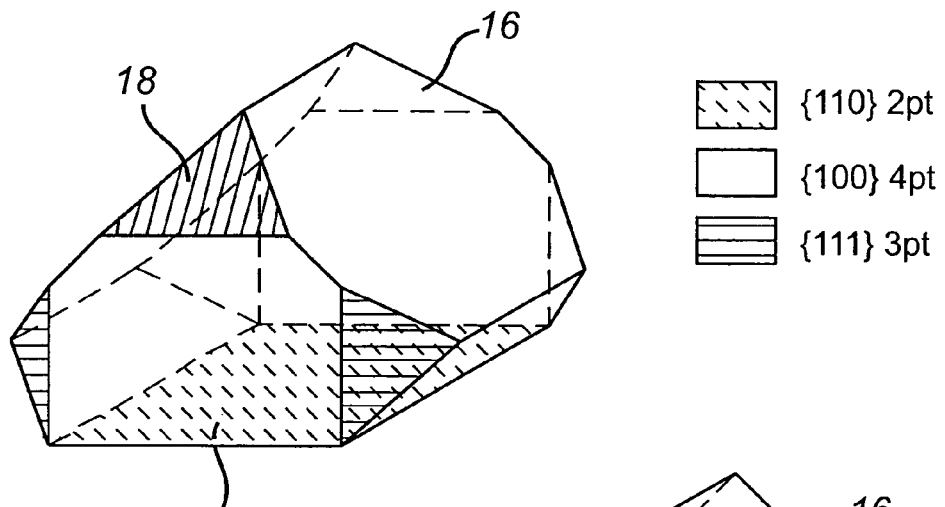
FIG. 2(b), illustrates the morphology of cold (predominantly cubic) single crystal diamond material grown according to a method of the present invention can be seen. The single crystal diamond has {110}, {100} and {111} faces (14, 16 and 18, respectively).
FIG. 2(c) is a schematic representation of a polished plate of single crystal diamond material which has been produced using the method of the present invention. The face (20) which was substantially parallel to the seed during synthesis, has a {110} crystallographic orientation.
Figure 2B:
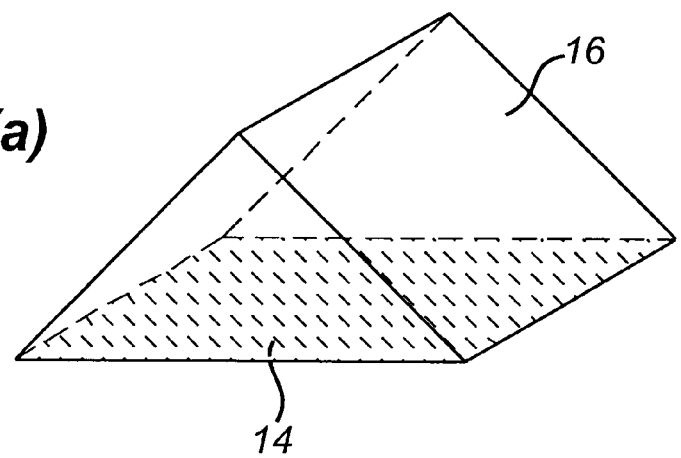
Figure 2C:
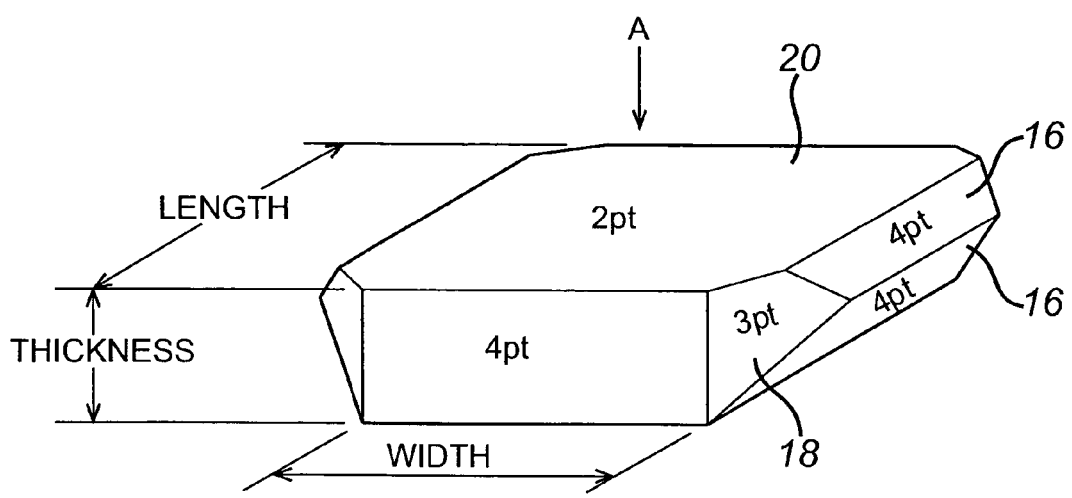
Figure 3A:
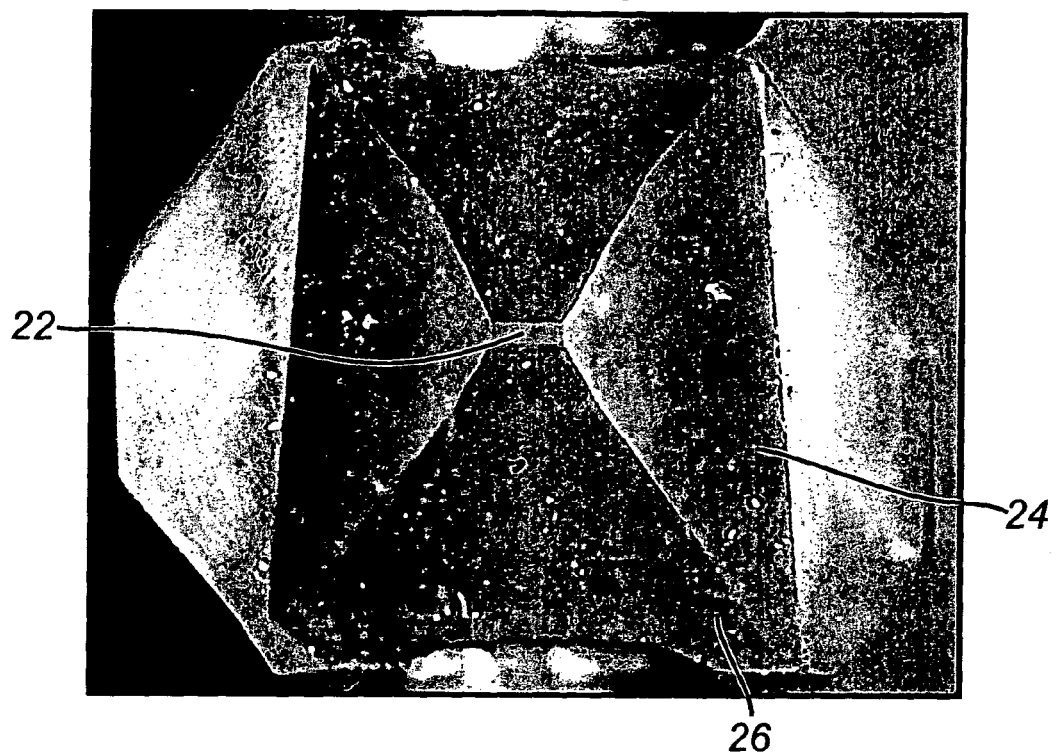
Figure 3B:
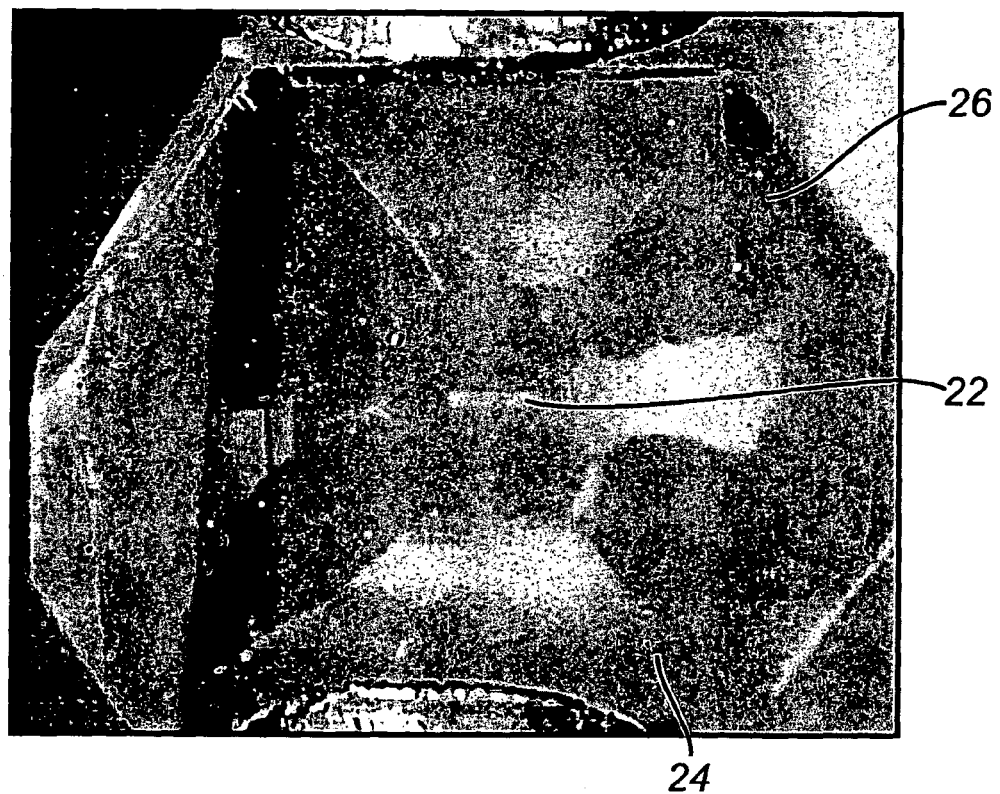

In the photoluminescence images (obtained using a DiamondView™ instrument) of the reference face and seed face of single crystal diamond material produced by the methods of the present invention in FIGS. 3(a) and (b), it is possible to see the different growth sectors which are present. The central bright blue growth sector (22) is a {110}, surrounded by strongly luminescing green {111} growth sectors (24) and dark {100} sectors (26).

Figure 4A:
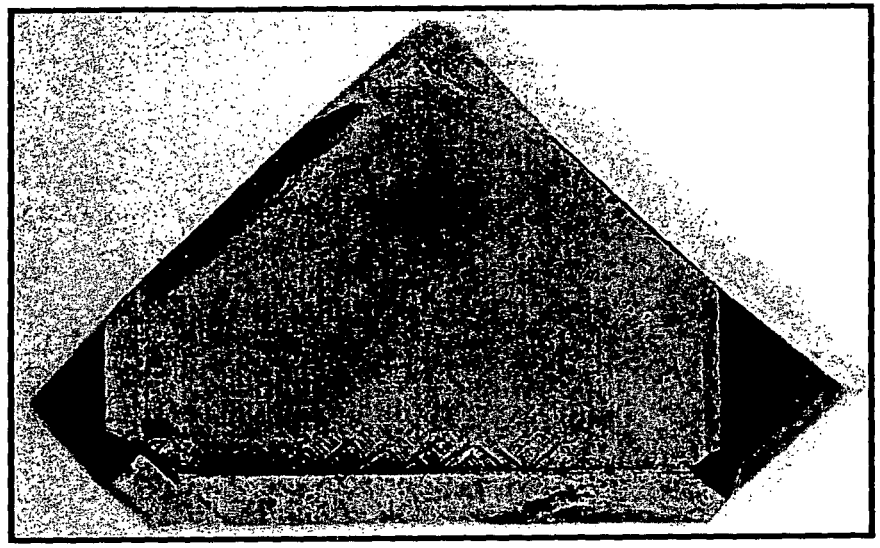

FIG. 4(a) is a side view of cubic single crystal material produced by Example 1 of the present invention.

Figure 4B:
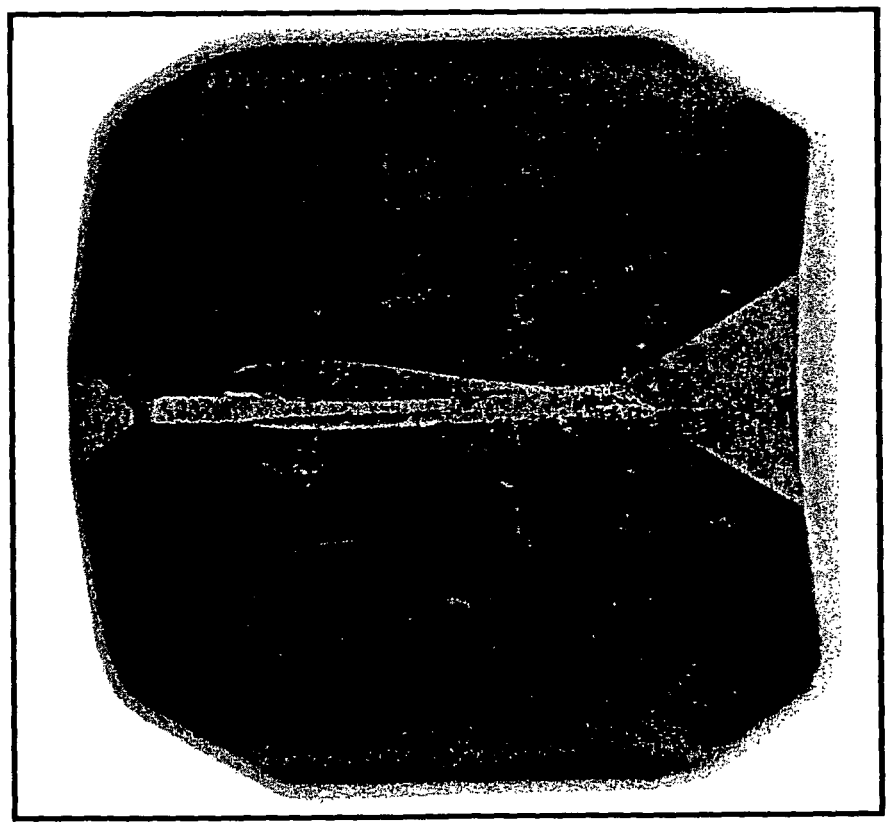

FIG. 4(b) is a plan view of cubic single crystal material produced by Example 2 of the present invention.

EXAMPLES

Example 1

A set of 89 seeds made from HPHT synthetic diamond were selected. The seeds had a polished top (growth) surface ($R_a$ measured with a stylus profilometer to be less than 100 nm) and were laser cut using a Nd:YAG laser from larger <110>-oriented plates. The seeds were approximately equi-axed with dimensions of about 0.5 mm×0.5 mm×0.5 mm and thus had an aspect ratio of close to 1. The seed geometry was such that the growth surface was within 10° of the {110} crystallographic plane and two of the edges of the growth surface were within 10° of <110> directions, while two of the edges of the growth surface were within 10° of <100> directions.

The seeds were arranged on a seedpad using a square layout with a separation between seeds of approximately 6.4 mm, and a separation between rows of approximately 6.4 mm.

The seedpad loaded with seeds was assembled into an HPHT press capsule together with a solvent catalyst metal consisting of Ni, Fe and Co (Ni 69 wt %, Fe 26 wt %, Co 5 wt %).

The assembled capsule was loaded into a HPHT press and ramped to a synthesis pressure of 5.5 GPa and a temperature of 1380° C. to target synthesised diamond with a "hot" morphology.

89 stones were recovered from the synthesis run. The recovered stones had a size range from 3.5×4.0×2.8 mm to 4.5×5.5×3.5 mm, and had a "hot" morphology.

Example 2

A set of 160 seeds made from HPHT synthetic diamond were selected. The seeds had a polished top (growth) surface ($R_a$ measured with a stylus profilometer to be less than 100 nm) and were laser cut using a Nd:YAG laser from larger <110>-oriented plates. The seeds were approximately equi-axed with dimensions of approximately 0.5 mm×0.5 mm×0.5 mm and thus had an aspect ratio of close to 1. The seed geometry was such that the growth surface was within 10° of the {110} crystallographic plane and two of the edges of the growth surface were within 10° of <110> directions, while two of the edges of the growth surface were within 10° of <100> directions.

The seeds were arranged on a seed pad using a triangular layout with a separation between adjacent seeds of approximately 5.0 mm.

The seed pad loaded with seeds was assembled into an HPHT press capsule together with a solvent catalyst metal consisting of Ni, Fe and Co (Ni 69 wt %, Fe 26 wt %, Co 5 wt %).

The assembled capsule was loaded into a HPHT press and ramped to a synthesis pressure of 5.5 GPa and a temperature of 1310° C. to target synthesised diamond with a "cold" morphology.

160 stones were recovered from the synthesis run. The recovered stones had a size range from 2.5×2.9×2.0 mm to 3.3×3.8×2.6 mm, and had a "cold" morphology as illustrated in FIGS. 4(a) and 4(b).

The invention claimed is:

1. A method for synthesizing single crystal diamond comprising:
   (a) selecting a single crystal diamond seed having a growth surface with two orthogonal dimensions a* and b*, where a* is the longest dimension of the growth surface substantially aligned along a <100> or <110> direction in the plane of the growth surface, and b* is the longest dimension of the growth surface in a direction orthogonal to a* lying in the plane of the growth surface, where the aspect ratio of the growth surface which is defined as a*/b* is at least 1 and the growth surface is substantially parallel to a {110} crystallographic plane;
   (b) mounting the seed on or into a surface of a substrate such that the growth surface of the seed is exposed and the growth surface of the seed is substantially parallel to the surface of the substrate; and
   (c) effecting crystal growth in a high pressure high temperature environment at a temperature greater than 1280° C. under conditions such that a single crystal diamond is produced on at least the growth surface of the seed;
   wherein the synthesized single crystal diamond has a longest dimension $a^\#$ aligned along a <100> or <110> direction, which exceeds at least 2 mm.

2. A method according to claim 1, wherein the edges of the growth surface of the single crystal diamond seed are within about 20° of either <100> or <110> directions or a mixture of <100> and <110> directions.

3. A method according to claim 1, wherein in step (c), crystal growth is effected at a temperature in the range from 1280° C. to 1320° C.

4. A method according to claim 1, wherein in step (c), crystal growth is effected at a temperature in the range from 1350° C. to 1390° C.

5. A method according to claim 1, wherein the growth surface of the single crystal diamond seed has a dimension, a*, of at least 0.25 mm.

6. A method according to claim 1, wherein the normal to the growth surface of the single crystal diamond seed lies within 20° of a <110> direction.

7. A method according to claim 1, wherein in step (c), crystal growth is effected at a pressure in the range from 5 to 6 GPa.

8. A method according to claim 1, wherein the diamond seed selected is such that at least about 30% of the area of the growth surface of the seed is a single growth sector.

9. A method according to claim 1, wherein the diamond seed selected has a surface roughness, $R_a$, of less than about 100 nm.

10. A method according to claim 1, wherein the diamond seed selected has a low level of strain, such that the birefringence over at least 50% of the area of the growth surface of the seed is less than $5 \times 10^{-3}$.

11. A method according to claim 1, wherein the aspect ratio of the growth surface of the single crystal diamond seed which is defined as a*/b* is less than 1.5.

12. A method according to claim 1, wherein in step (c), crystal growth is effected in a temperature range from 1280° C. to 1390° C.

* * * * *